United States Patent [19]
Tokitou et al.

[11] Patent Number: 5,150,216
[45] Date of Patent: Sep. 22, 1992

[54] SOLID-STATE IMAGE SENSING DEVICE HAVING AN OPTIMUM OVERFLOW DRAIN VOLTAGE GENERATION CIRCUIT

[75] Inventors: Yoshihiko Tokitou, Yokohama; Atsushi Honjo, Tokyo, both of Japan

[73] Assignee: Kabushiki Kaisha Toshiba, Kawasaki, Japan

[21] Appl. No.: 684,566

[22] Filed: Apr. 12, 1991

[30] Foreign Application Priority Data

Apr. 13, 1990 [JP] Japan .................................. 2-97887

[51] Int. Cl.⁵ .......................................... H04N 5/335
[52] U.S. Cl. ........................... 358/213.11; 358/213.19; 358/213.23
[58] Field of Search ...................... 358/213.11, 213.23, 358/213.19; 307/264

[56] References Cited

U.S. PATENT DOCUMENTS

| | | | |
|---|---|---|---|
| 4,100,437 | 7/1978 | Hoff | 307/304 |
| 4,412,241 | 10/1983 | Nelson | 357/51 |
| 4,626,915 | 12/1986 | Takatsu | 358/213.19 |
| 4,672,455 | 6/1987 | Miyatake | 358/213.19 |
| 4,688,098 | 8/1987 | Kon | 358/213.19 |
| 4,689,550 | 8/1987 | Ujihara | 323/354 |
| 4,808,834 | 2/1989 | Kimata | 358/213.11 |
| 4,948,966 | 8/1990 | Argues | 358/213.11 |
| 4,963,983 | 10/1990 | Kohno | 358/213.23 |
| 5,028,948 | 7/1991 | Yamasaki | 358/213.19 |

FOREIGN PATENT DOCUMENTS 0346905 12/1989 European Pat. Off. .
2177542A 1/1987 United Kingdom .

OTHER PUBLICATIONS

*IBM Technical Disclosure Bulletin*, vol. 31, No. 11, Apr. 1989, "High Reliability Low-Cost Fuse Configuration", pp. 406–410.

*Electronics & Wireless World*, 95(1989) Jul. No. 1641, Sutton, Surrey, GB, p. 661.

Primary Examiner—James J. Groody
Assistant Examiner—Sherrie Hsia
Attorney, Agent, or Firm—Foley & Lardner

[57] ABSTRACT

The solid-state image sensing device comprises an operating voltage (e.g. overflow drain voltage) generating circuit formed on the semiconductor substrate. The circuit includes plural resistors connected in series between two voltage supply terminals; plural fuses connected in parallel to the resistors, respectively; and plural voltage selecting signal input terminals. In response to an external voltage selecting signal, since some parallel-connected fuses are melted away, a desired voltage lying within a predetermined range can be obtained at one of the series-connected resistors. Therefore, it is unnecessary to indicate the operating voltage on the device or to directly use the generated voltage for device activation.

3 Claims, 3 Drawing Sheets

SOLID-STATE IMAGE SENSING DEVICE HAVING AN OPTIMUM OVERFLOW DRAIN VOLTAGE GENERATION CIRCUIT

BACKGROUND OF THE INVENTION

The present invention relates to a solid-state image sensing device.

In a solid-state image sensing device, the input condition thereto changes according to the luminance of a subject to be sensed. Therefore, when a subject of a high luminance is image-sensed, since an excessive electric charge transduced from light energy by the photodiode section of the device leaks to the vertical register, a phenomenon can be observed such that light spreads on a monitor picture from a high luminance position to a low luminance position. This phenomenon is referred to as blooming phenomenon. To prevent this phenomenon, an overflow drain is conventionally provided for the image sensing device.

FIG. 5 is a sectional diagram of a solid-state image sensing device having an overflow drain, which is conventionally used.

An n region 20 is formed in the surface of a p-type silicon substrate 10. A p-n junction formed by the n region and the substarate forms a photo diode. If light 30 is irradiated at this photo diode, electric charges are generated at the photo diode and in response to open/close state of a transfer gate 50, these electric charges are moved to a CCD section 40 which stores and transfers the charges. At the other side of the photo diode, an overflow drain 60 is provided. The amount of excessive electric charges is controlled by a voltage applied to a gate 70.

FIG. 6 shows the relationship between the blooming rate and the voltage $V_{OFD}$ applied to the gate provided for the overflow drain. In the drawing, when the overflow drain voltage $V_{OFD}$ is sufficiently high as within a range A, since the blooming phenomenon can be sufficiently suppressed, it is possible to reduce the blooming rate in the case where a high luminance subject is image-sensed. In contrast, when the overflow drain voltage $V_{OFD}$ is low as within a range B, since the blooming phenomenon cannot be sufficiently suppressed, the blooming phenomenon is observed. As described above, the lower limit of the overflow drain voltage $V_{OFD}$ at which the blooming phenomenon can be suppressed is a point C corresponding to a boundary between the two ranges A and B. Therefore, the range A of the overflow drain voltage $V_{OFD}$ is a practical voltage range.

On the other hand, the overflow drain voltage $V_{OFD}$ exerts an influence upon the saturation characteristics in relation to the quantity of electric charge to be accumulated. FIG. 7 shows the relationship between the overflow drain voltage $V_{OFD}$ and the saturation voltage obtained by converting the quantity of accumulated electric charge. To increase the saturation voltage, it is desirable to reduce the overflow drain voltage $V_{OFD}$. However, since there exists a limit of the quantity of accumulated electric charge, it is impossible to increase the electric charge quantity beyond the limit, even if the voltage $V_{OFD}$ is reduced unnecessarily.

On the other hand, the saturation voltage should be higher than a white-clip level when the image signals are processed. Therefore, although it is effective to determine a higher overflow drain voltage $V_{OFD}$ in order to sufficiently suppress the blooming phenomenon, the overflow drain voltage must be lower than the value corresponding to the minimum saturation voltage. In general, because low blooming is more important than high saturation voltage, the overflow drain voltage $V_{OFD}$ is not set to the value C, which corresponds to the saturation voltage F, having excessive margin but E, which corresponds to the minimum saturation voltage D.

As described above, the overflow drain voltage $V_{OFD}$ is adjusted according to the usage. Further, since this voltage $V_{OFD}$ differs according to the manufacturing process, the voltage $V_{OFD}$ ranges between several volts and tens and several volts.

In practice, therefore, each solid-state image sensing device is inspected at the wafer stage in order to detect an optimum overflow drain voltage $V_{OFD}$. However, it is necessary to indicate or store the detected optimum voltage $V_{OFD}$ by use of some means. Or else, the same inspection work must be repeated at the stage of device forming process.

Conventionally, therefore, an optimum overflow drain voltage $V_{OFD}$ is indicated on a predetermined position 702 of a casing 701 of a solid-state image sensing device, as shown in FIG. 8, in order to eliminate the waste inspection work. That is, when the solid-state image sensing device is assembled in an apparatus (e.g. camera), an optimum overflow drain voltage is applied to the image sensing device by reading the previously indicated $V_{OFD}$.

The prior-art method of indicating various optimum voltages by stamping work, for instance is very troublesome in mass-production process, in particular. This is because since the optimum overflow drain voltage $V_{OFD}$ of the devices differ from each other as already explained, the optimum voltages must be classified into about several tens of ranges at 0.5 V intervals in general before stamping the indication values. Where the above-mentioned troublesome work is performed by workers, the efficiency is extremely low and further there exists a problem in that error is inevitably produced during the classification and stamping work. To overcome this problem, although it may be possible to automatize the above-mentioned work, the automation system may entail extremely high development and manufacturing costs, because the optimum values inspected in the inspection process must be stored in relation to the corresponding devices and further stamped on the corresponding devices.

Similar problems arise when other device operating voltages (e.g. reset voltage) are inspected, classified and stamped, as well as the overflow drain voltage.

SUMMARY OF THE INVENTION

Therefore, an object of the present invention is to provide a solid-state image sensing device which can reduce the optimum operating voltage indicating work, without use of any automatic voltage indicating system.

To achieve the above-mentioned object, the present invention provides a solid-state image sensing device, comprising:

photoelectric transducing means for generating electric charges corresponding to incident light intensity;

charge transferring means for accumulating and transferring electric charge generated by said photoelectric transducing means; and voltage generating means responsive to an external voltage selecting signal, for generating a voltage corresponding to the voltage selecting signal and lying within a predetermined range.

In the solid-state image sensing device according to the present invention, whenever an external voltage selecting signal is inputted to the device, the voltage generating means generates a voltage corresponding to the inputted voltage selecting signal and lying within a predetermined range. Since the above-mentioned voltage generating means is formed in the solid-state image sensing device, a required operating voltage can be generated by the device itself. Therefore, it is unnecessary to indicate the voltage on the device casing, and further it is possible to directly use the generated voltage for device activation. Here, the voltage generated by the voltage generating means is preferably the voltage applied to the overflow drain of the device.

When the voltage generating means is a resistance divider circuit, since some fuses are melted in response to the voltage selecting signal inputted to the device from outside the device, the resistance between a voltage supply terminal and a ground terminal changes, so that a voltage corresponding to the inputted voltage selecting signal is generated at the connection end of the series-connected resistors.

As described above, since the solid-state image sensing device according to the present invention is provided with means for generating a voltage determined in response to a voltage selecting signal inputted to the device from outside, it is possible to generate a necessary voltage from the device itself, thus eliminating the indication of device voltage on the device surface. Therefore, it is unnecessary to develop a new automatic voltage indicating system for automatically stamping operating voltages on the device casings.

DESCRIPTION OF THE PREFERRED EMBODIMENTS

An embodiment of the present invention will be described hereinbelow with reference to the attached drawings. A solid-state image sensing device according to the present invention is provided with means for generating a voltage lying within a predetermined range. This voltage generating means is so controlled as to generate an optimum overflow drain voltage $V_{OFD}$ in response to an external signal.

Figure 1:
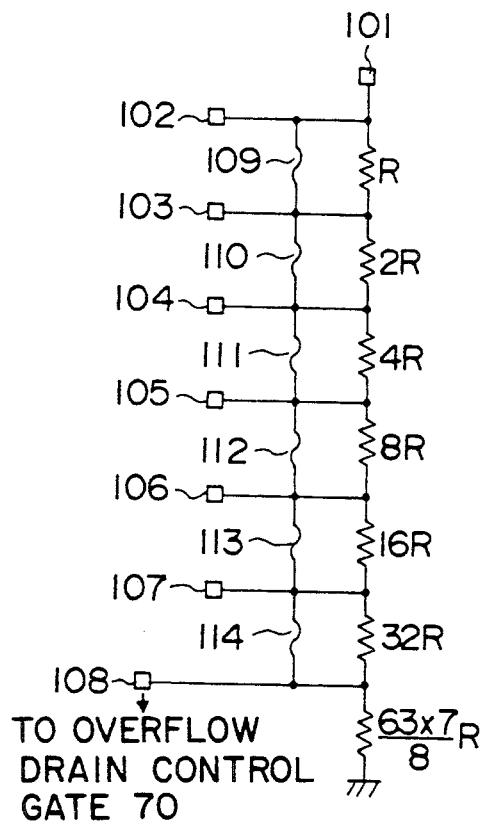
FIG. 1 is a circuit diagram showing a configuration of an embodiment of the voltage generating circuit of the solid-state image sensing device according to the present invention.

FIG. 1 shows the voltage generating means provided for the solid-state image sensing device according to the present invention. The voltage generating means is a resistance divider circuit for generating any required voltage. A plurality of resistors R, 2R, 4R, 8R, 16R, 32R and $(63 \times \frac{1}{2})$R are connected in series between a voltage supply terminal 101 and a ground 120. The resistance values of these resistors 2R to 32R are in a two's multiple arrangement. In addition, each of a plurality of fuses 109 to 114 are connected in parallel to each of the resistors R to 32R. In more detail, the resistor R and the fuse 109 are both connected between two fusing terminals 102 and 103; the resistor 2R and the fuse 110 are connected between two fusing terminals 103 and 104; the resistor 4R and the fuse 111 are both connected between two fusing terminals 104 and 105; the resistor 8R and the fuse 112 are both connected between two fusing terminals 105 and 106; the resistor 16R and the fuse 113 are both connected between two fusing terminals 106 and 107; and the resistor 32R and the fuse 114 are both connected between two fusing terminals 107 and 108, respectively. Further, an overflow drain voltage $V_{OFD}$ required to be generated can be outputted through an output terminal 108 and provided to overflow drains of a CCD.

Figure 2:
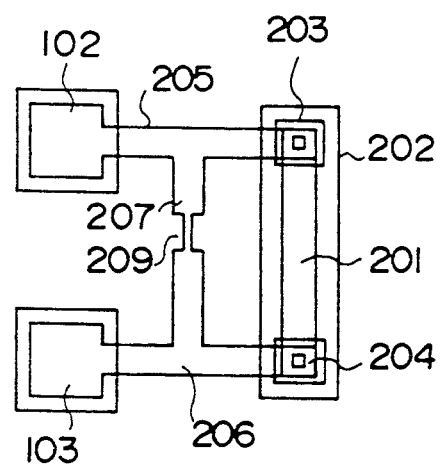
FIG. 2 is an enlarged plan view showing a fuse and a resistor formed on a semiconductor substrate of the device.

FIG. 2 is an enlarged view showing the resistor R and the fuse 109 both formed on a semiconductor substrate, by way of example. In the drawing, n+ diffusion layers 203 and 204 are formed on both ends of a gate region 202, and an n diffusion layer 201 constituting the resistor R is formed between the two n+ diffusion layers 203 and 204. These two n+ diffusion layers 203 and 204 are connected to two aluminium wires 205 and 206 via two contacts 203 and 204, respectively at each one end thereof, and the two fusing terminals 102 and 103 are formed on the wires 205 and 206, respectively at each other end thereof.

The two aluminium wires 205 and 206 are connected to each other via a bridge wire 203 formed with a narrower portion 209. Being high in resistance, this narrower portion 209 corresponds to a fuse 109 melted away when a predetermined high voltage is applied between the two fusing terminals 102 and 103.

Figure 3:
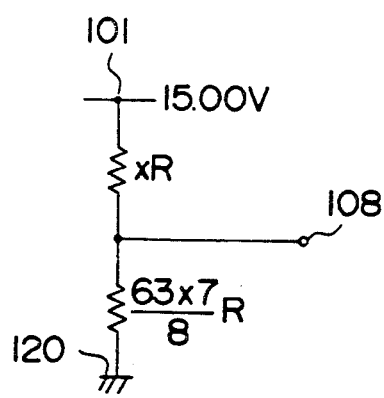
FIG. 3 is a diagram showing an equivalent circuit of FIG. 1.

In the resistance divider circuit as described above, any desired voltages can be outputted through the output terminal 108 by selecting the resistance of the series-connected resistors R to 32R as follows: For instance, the assumption is made that a voltage of 10.00 V is required to be outputted through the output terminal 108 when a supply voltage of 15.00 V is applied to the voltage supply terminal 101, as shown by an equivalent circuit in FIG. 3. In this example, the following formula (1) can be established:

$$5.00 \text{ V}:10.00 \text{ V}=xR:(63\times\tfrac{1}{2})R \tag{1}$$

where xR denotes the resistance required between the voltage supply terminal 101 and the output terminal 108. Therefore, the resistance of xR is 27.5625 or approximately 28 as a two's multiple value. If six resistors R to 32R are considered as 6-bits and therefore indicate integers from 0 to 63, the third, fourth and fifth resistors 4R, 8R and 16R are to be selected in order to obtain a resistance 28R between the voltage supply terminal 101 and the output terminal 108. That is, the fuses 111, 112 and 113 must be melted away to allow current to flow through the three resistors 4R, 8R and 16R. Therefore, these three fuses 111, 112 and 113 are melted by passing fusing current between the two fusing terminals of 104 and 105, 105 and 106, and 106 and 107, respectively.

In general, a sum total resistance to be selected is referred to as fusing code C. The fusing code C required to generate a desired voltage (i.e. an optimum overflow drain voltage $V_{OFD}$) through the output terminal 108 can be expressed as $$C = (15.00 - V_{OFD}) \times 63 \times 7/(V_{OFD} 33 8) \quad (2)$$

Figure 4:
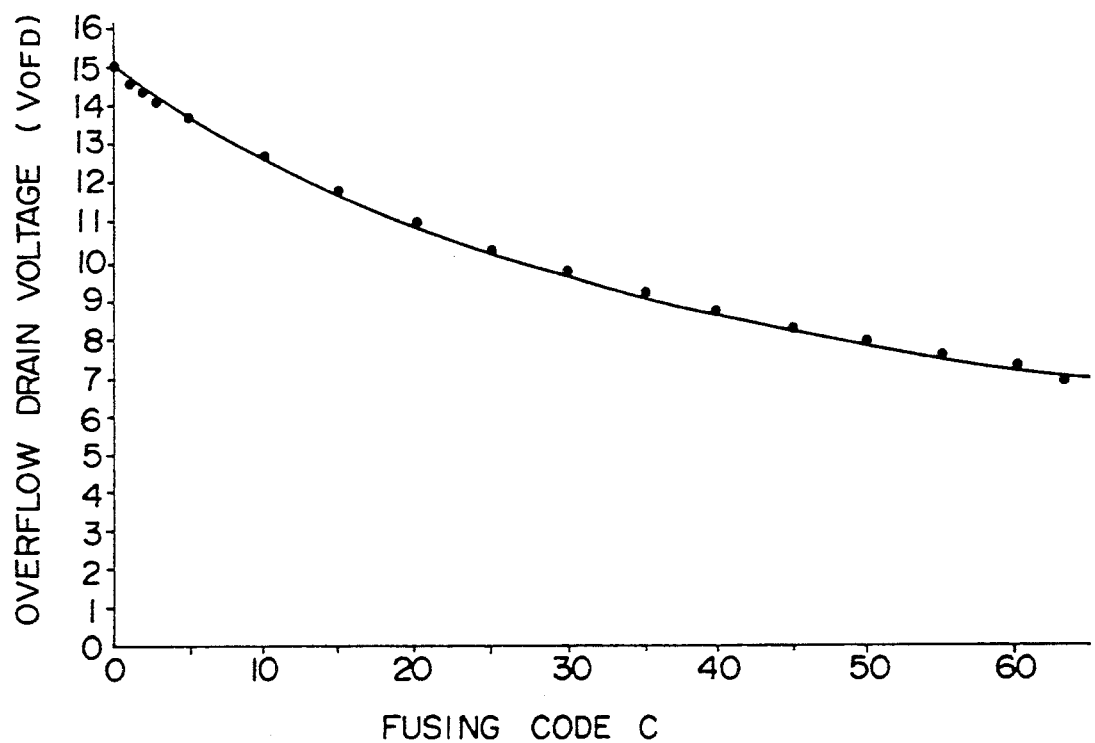
FIG. 4 is a graphical representation showing the relationship between the fusing cord C and the overflow drain voltage $V_{OFD}$ in the voltage generating circuit of the solid-state image sensing device shown in FIG. 1.
Figure 5:
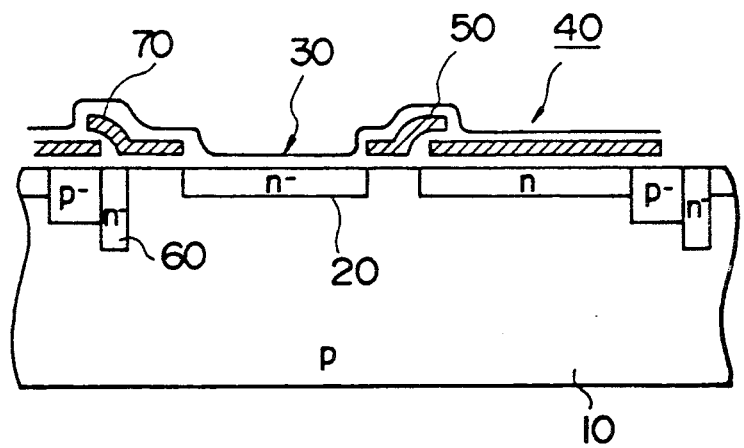
FIG. 5 is a sectional view of a conventional solid-state image sensing device having an overflow drain.
Figure 6:
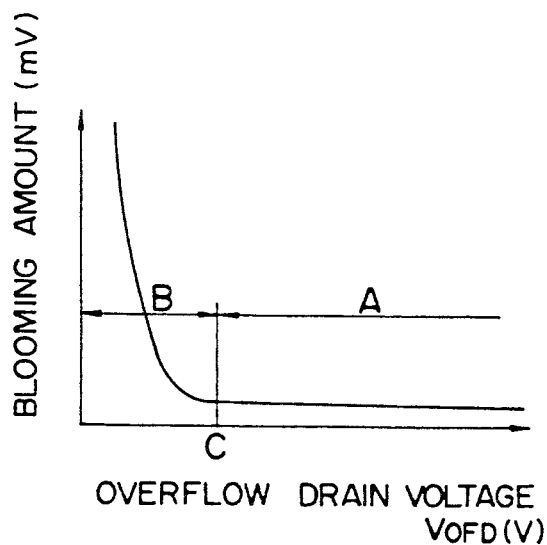
FIG. 6 is a graphical representation showing the relationship between the overflow drain voltage $V_{OFD}$ and the blooming rate in an ordinary solid-state image sensing device.
Figure 7:
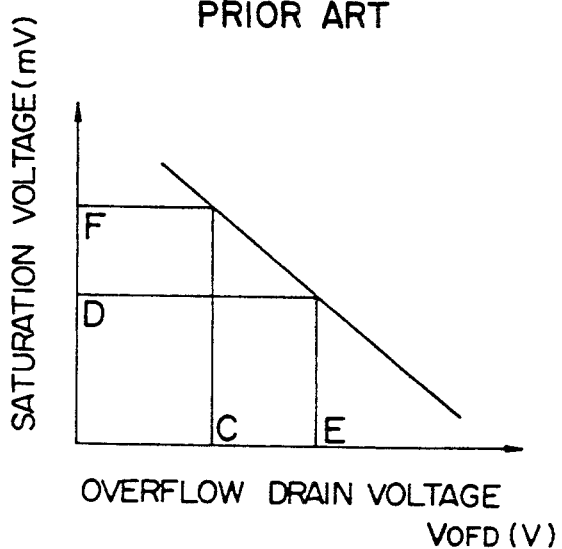
FIG. 7 is a graphical representation showing the relationship between the overflow drain voltage $V_{OFD}$ and the saturation voltage of an ordinary solid-state image sensing device.
Figure 8:
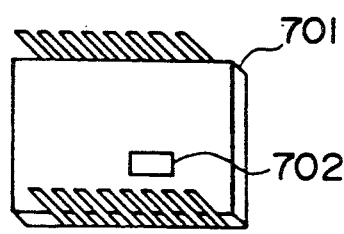
FIG. 8 is a perspective view showing a casing of a prior-art solid-state image sensing device.

FIG. 4 shows the relationship between the fusing code C as expressed by the formula (2) and the overflow drain voltage $V_{OFD}$. Therefore, it is possible to easily obtain any required fusing code C by use of the graph as shown in FIG. 4.

FIG. 4 indicates that the voltage range obtainable through the output terminal 108 is from 7 to 15 volts. However, this voltage range can be changed easily by adjusting the supply voltage applied to the voltage supply terminal 101 and the resistances of the respective resistors.

As described above, in the embodiment of the present invention, it is possible to generate any desired voltages through the output terminal 108 by passing fusing current between some pairs of the fusing terminals from the outside to melt some fuses from 109 to 114, so that some resistors from R to 32R can be selected. Therefore, it is possible to generate any optimum overflow drain voltage $V_{OFD}$ determined during the inspection process at the wafer stage, inside the device. Accordingly, since an optimum voltage applied to the overflow drain of the device can be easily known, it is unnecessary to inspect for the same optimum voltage again at the stage where the wafer is manufactured into the device or to develop an automatic voltage indicating system at high cost, thus reducing the inspection time and the device cost.

The above embodiment has been described only by way of example, without limiting the present invention thereto. For instance, the voltage generating means is not limited to only the resistance divider circuit as shown in FIG. 1, but any voltage generating means for generating any required operating voltages in response to external signals can be adopted. Further, the generated voltage is not limited to only the overflow drain voltage, but the reset voltage can be generated. Further, it is not necessarily required that the device be provided with means for outputting the generated voltage externally. That is, it is possible to directly apply the generated voltage to the overflow drain within the device itself. In this case, it is also possible to reduce the device cost, without need of any automatic voltage indicating system.

What is claimed is:

1. A solid-state image sensing device, comprising:
   photoelectric transducing means for generating electric changes in response to incident light intensity;
   charge transferring means for accumulating and transferring electric charges generated by said photoelectric transducing means;
   an overflow drain to drain excessive charge; and
   voltage generating means, responsive to a voltage selecting signal provided externally and connected to said overflow drain, for generating an adaptive overflow drain voltage to be applied to said overflow drain, said adaptive overflow drain voltage causing maximum blooming suppression, said voltage generating means including a voltage divider circuit having a plurality of resistors connected in series between voltage supply terminals.

2. A solid-state image sensing device according to claim 1, wherein said overflow drain voltage is selected as a highest value that is less than a value corresponding to minimum saturation voltage.

3. A solid-state image sensing device according to claim 1, wherein said voltage generating means further comprises:
   a plurality of fuses connected parallel to said plurality of resistors, respectively; and
   a plurality of voltage selecting signal input terminals provided between two ends of each of said fuses, respectively, to receive said voltage selecting signal to blow said fuses such that said adaptive overflow drain voltage is generated at a connection end of said resistors due to a change in resistance between said voltage supply terminals.

* * * * *